(12) United States Patent
Satoguchi (10) Patent No.: US 6,415,192 B1
(45) Date of Patent: Jul. 2, 2002

(54) PROCESS FLOW PREPARATION SYSTEM AND METHOD

(75) Inventor: Yuuichi Satoguchi, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/249,851

(22) Filed: Feb. 16, 1999

(30) Foreign Application Priority Data

Feb. 17, 1998 (JP) .......................................... 10-035027

(51) Int. Cl.⁷ .............................................. G06F 19/00
(52) U.S. Cl. .......................................... 700/96; 700/121
(58) Field of Search ............................... 700/121, 116, 700/917, 108, 103, 95, 96

(56) References Cited

U.S. PATENT DOCUMENTS

| | | | | |
|---|---|---|---|---|
| 4,796,194 A | * | 1/1989 | Atherton | 700/103 |
| 4,901,242 A | * | 2/1990 | Kotan | 700/108 |
| 5,495,417 A | * | 2/1996 | Fuduka et al. | 700/121 |
| 5,694,353 A | * | 12/1997 | Koike | 365/145 |
| 5,862,050 A | * | 1/1999 | Toyota | 700/97 |
| 5,886,896 A | * | 3/1999 | Lantz et al. | 700/116 |
| 5,937,323 A | * | 8/1999 | Orczyk et al. | 438/624 |
| 6,041,270 A | * | 3/2000 | Steffan et al. | 700/121 |
| 6,112,130 A | * | 8/2000 | Fukuda et al. | 700/121 |

OTHER PUBLICATIONS

Bastiaan, "Process model and recipe structure, the conceptual design for a flexible batch plant", 1998, Elsiver Science Ltd., vol. 36 No. 4, pp. 249–255.*

* cited by examiner

Primary Examiner—Leo Picard
Assistant Examiner—Chad Rapp
(74) Attorney, Agent, or Firm—Oblon, Spivak, McClelland, Maier & Neustadt, P.C.

(57) ABSTRACT

A process flow preparation system including a condition receiving unit for receiving and storing at least one process condition, a recipe storing unit for storing recipe names and corresponding process conditions, a recipe searching unit for searching and retrieving from the recipe storing unit at least one recipe meeting the at least one process condition. Also included is a process sequence receiving unit for receiving and storing a process sequence of the at least one retrieved recipe, and a process flow output unit for outputting a process flow including the at least one retrieved recipe and the process sequence of the at least one retrieved recipe. Further, the recipe searching unit searches for one or more recipes meeting the at least one process condition from the recipe storing unit, determines whether or not the search has retrieved a single result, and prompts an operator to input at least one of a process condition name and a process condition value for specifying results of the search.

12 Claims, 10 Drawing Sheets

| PROCESS CONDITION NAME / RECIPE NAME | --- | HS-1 | --- | HS-2 | HS-3 | --- |
|---|---|---|---|---|---|---|
| --- | --- | --- | --- | --- | --- | --- |
| MAIN CATEGORY OF PROCESS | --- | ETCHING | --- | ETCHING | ETCHING | --- |
| SUB CATEGORY OF PROCESS | --- | RIE | --- | RIE | RIE | --- |
| FILM | --- | SiO₂ or SiN | --- | SiO₂ | SiO₂ or SiN | --- |
| UNIFORMITY | --- | 10~20 | --- | 10~20 | 30~90 | --- |
| TIME | | | | | | |

CONDITION INPUT WINDOW

| PROCESS CONDITION NAME 1 | PROCESS CONDITION VALUE 1 |
| --- | --- |
| PROCESS CONDITION NAME 2 | PROCESS CONDITION VALUE 2 |
| PROCESS CONDITION NAME 3 | PROCESS CONDITION VALUE 3 |

SEARCH RECIPE

FIG.7

SEARCH RESULT WINDOW

NUMBER OF RECIPES
MEETING CONDITION IS

3

INPUT MORE CONDITIONS

| PROCESS CONDITION NAME 1 | PROCESS CONDITION VALUE 1 | |
|---|---|---|
| PROCESS CONDITION NAME 2 | PROCESS CONDITION VALUE 2 | SEARCH RECIPE |

PROCESS FLOW                                                                        401

1 NAME=HS-3   COND=(M=ETCHING+S=RIE+FILM=SIN+UNFORMITY≧30)
2 NAME=NC-1   COND=(M=RINSE+REMOVE=IRON+RATE≧90)
3 NAME=FBX1   COND=(M=OXID+TIME=30+GAS≧O2)
4 NAME=QC1    COND=(M=MEASURETHICK+REG=100nm±10nm)

FIG.10

PROCESS FLOW PREPARATION SYSTEM AND METHOD

BACKGROUND OF THE INVENTION

1. Field of the Invention

The present invention relates to a process flow preparation system, more particularly, to a technology for achieving high efficiency of the process flow preparation.

2. Description of Related Art

There are a large number of processes in the production of semi-conductors, and each process has many conditions. Therefore, in the prior art, an operator prepares the process flow and the manufacture of the semiconductor occurs according to the procedure of the process flow. The computer system used for preparing the process flow is called a process flow preparation system.

Figure 1:
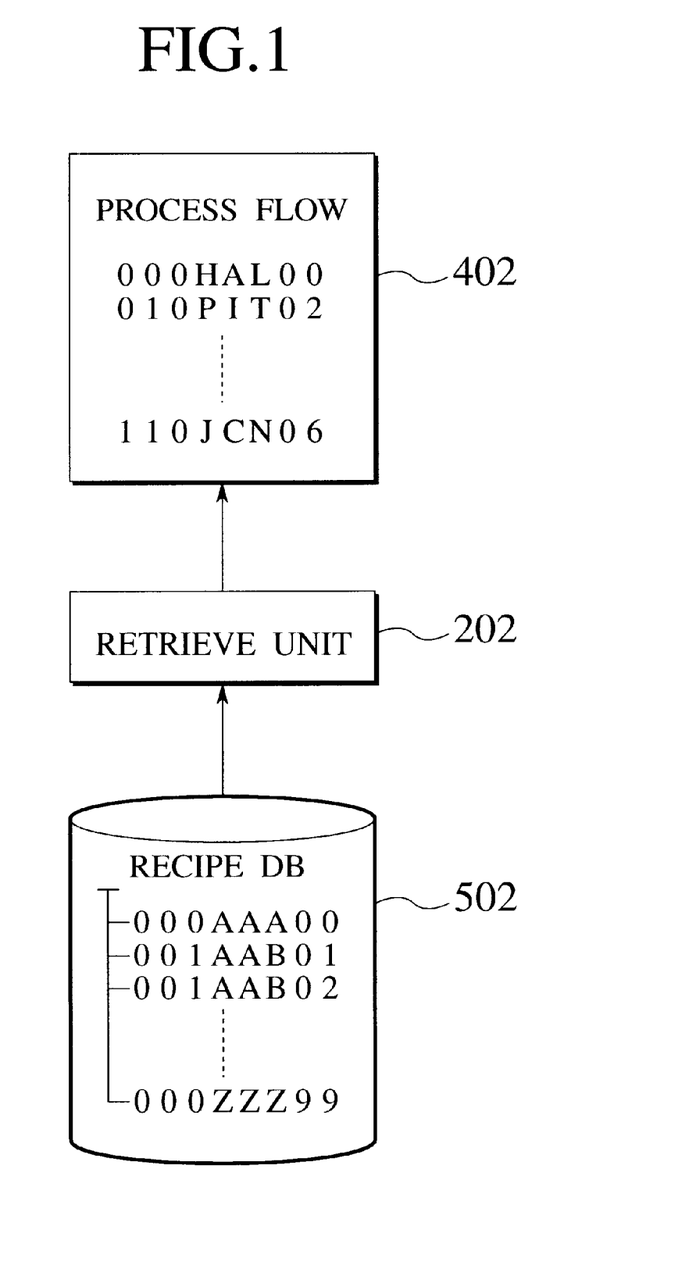
FIG. 1 is a block diagram showing a process flow preparation system according to a related art.

FIG. 1 is a block diagram showing a process flow preparation system according to a related art. The process flow preparation system comprises a retrieve unit 202 and a recipe database (DB) 502. The recipe DB 502 stores recipes provided in detail for the process and their conditions. A signal code is used to retrieve a type of recipe corresponding to a combination of processing conditions including oxidation, LPCVD, time, film thickness. An operator will input process conditions into the retrieve unit 202, which will then retrieve the recipe DB for a signal process code that corresponds to the input conditions.

However, in the related art described above, there is the problem of the operator who prepares the process flow does not intuitively grasp the details of the process, because the process is represented by a meaningless code.

SUMMARY OF THE INVENTION

An object of the present invention is to provide an intuitively understandable process flow preparation system and method, and computer program product used in a process flow preparation system for achieving high efficiency of the process flow preparation.

As a preferred embodiment, a process flow preparation system comprises a condition receiving unit for receiving and storing at least one process condition; a recipe storing unit for storing recipe names and recipe process conditions; a recipe retrieving unit for retrieving a recipe meeting the conditions from the recipe storing unit; a process sequence receiving unit for receiving and storing a process sequence; and a process flow output unit for outputting process flow including retrieved recipe and process sequence.

As described above, since an operator specifies the recipe easily and naturally, the efficiency of preparation regarding the process flow can increase.

In another preferred embodiment, a process flow preparation system comprises a process flow storing unit; a condition receiving unit that retrieves the process flow storing unit for process flow that will be modified, and receives at least one process condition of the recipe to be modified; a recipe storing unit for storing recipe names and process conditions of the recipe; a recipe retrieving unit for retrieving at least one recipe meeting the conditions from the recipe storing unit; a process sequence receiving unit for receiving a process sequence to be stored as a process sequence for the retrieved recipe, and a process flow output unit for outputting process flow including the retrieved recipe and process sequence information of the recipe.

As describe above, this embodiment modifies an existing process flow. In this situation, since an operator specifies the recipe freely, the efficiency of preparation regarding process flow can increase.

As a preferred embodiment, the recipe retrieving unit retrieves for one or more recipes meeting the conditions from the recipe storing unit, determines whether or not the retrieving result is single, and if more than one result is returned, prompts an operator to input process condition name(s) and/or process condition value(s) for specifying the retrieving results.

As a preferred embodiment, the process flow output unit outputs a process flow including the retrieved recipe, process sequence information of the recipe, and the received process conditions.

As described above, the embodiment shows only the conditions used in the retrieved recipe. In this fashion, the process flow can be a display device like a CRT, and an operator can grasp the process easily and intuitively.

BRIEF DESCRIPTION OF THE DRAWINGS

The objects, features and advantages of the present invention will become more apparent from the following description of a preferred embodiment taken in conjunction with the accompanying drawings, in which.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

To provide the process flow preparation system of the present embodiment, software that realizes the processing as described below is prepared, and a computer system is used for enabling implementation of the processing. The term 'computer system' may include a main frame computer, workstation, PC, or the like. The hardware configuration of the computer system used in the present embodiment includes a CPU that performs various operations, an input device, such as a keyboard, mouse, light-pen, or a flexible disk device, an output device, such as a display or a printer, and other devices. The CPU includes an operating unit that processes commands associated with the processing of each scheduling unit as explained later, and a main storage unit that stores the commands generated during the processing. The operating unit sequentially reads commands stored in the main memory unit, or external storage device, and executes the commands so as to perform processing for process flow preparation.

Figure 2:
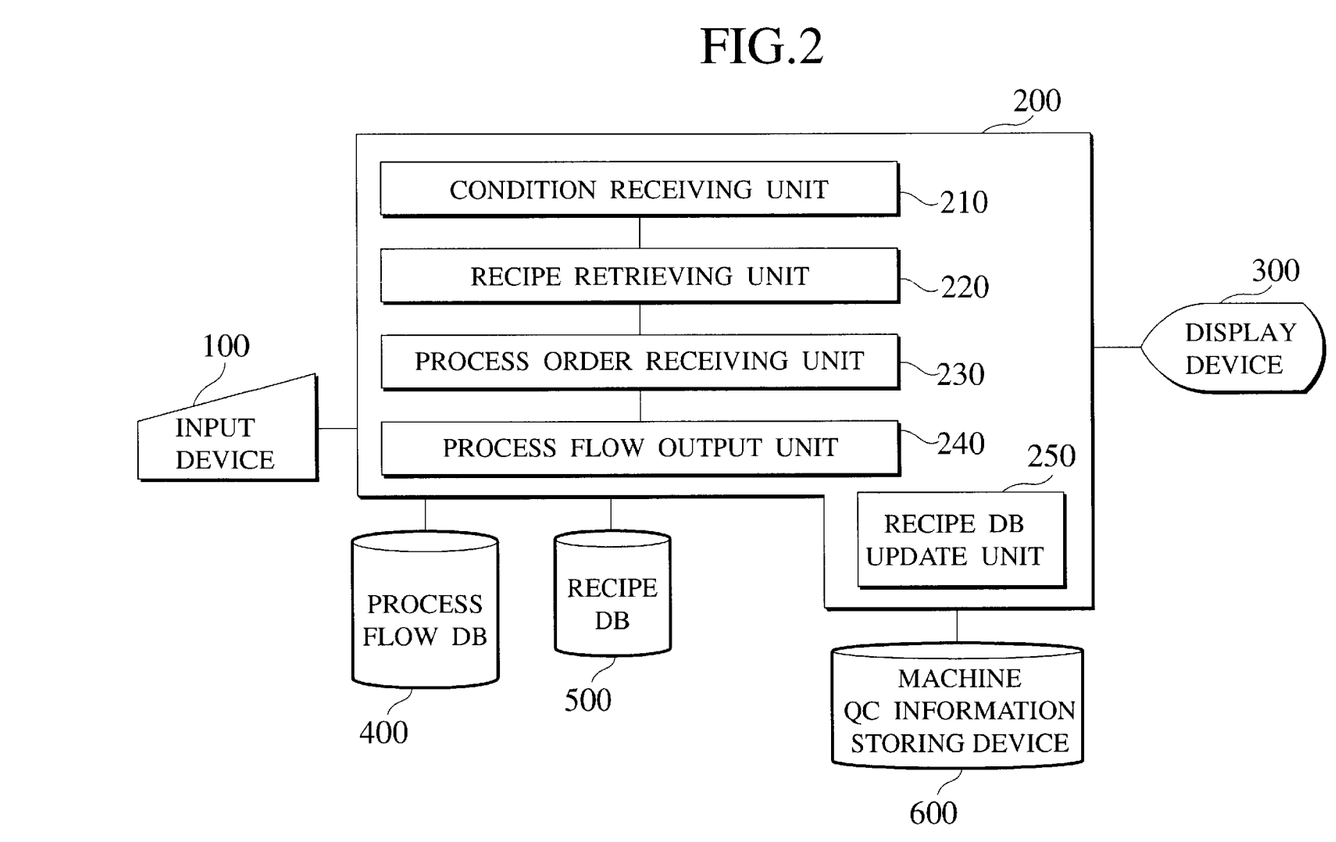
FIG. 2 is a block diagram showing a process flow preparation system according to an embodiment of the present invention.

FIG. 2 is a block diagram showing a process flow preparation system according to an embodiment of the present invention. The computer system mentioned above is employed to implement the process flow preparation system, and the input device mentioned above is used as input device 100. Also, the output device mentioned above is used as the display device 300. Furthermore, process flow DB 400 for storing the process flow, recipe DB 500 for storing the recipe name and recipe process conditions, and machine QC data storing drive 600 is stored at external memory, etc. as described above.

In the present embodiment, a process flow preparation system comprises a condition receiving unit 210 for receiving and storing at least one process condition, a recipe retrieving unit 220 for retrieving at least one recipe meeting the conditions from the recipe DB 500, a process sequence receiving unit 230 for receiving process sequence to store the process sequence, and a process flow output unit 240 for outputting process flow include a retrieved recipe and process sequence.

The process flow preparation system may comprise a recipe DB updating unit 250 for updating the recipe DB 500 based on machine QC (Quality Control) information 600. The recipe updating unit 250 will be explained hereinbelow. For example, machines installed in a factory, plant, or the like, are controlled by a QC system, the QC system often having machine QC information 600 in connection with recipe for each machine. In this situation, the recipe DB updating unit 250 can load the machine QC information from the machine QC information storing unit 600, and the unit 250 can append, modify, or delete the recipes stored in the recipe DB 500.

Figure 3:
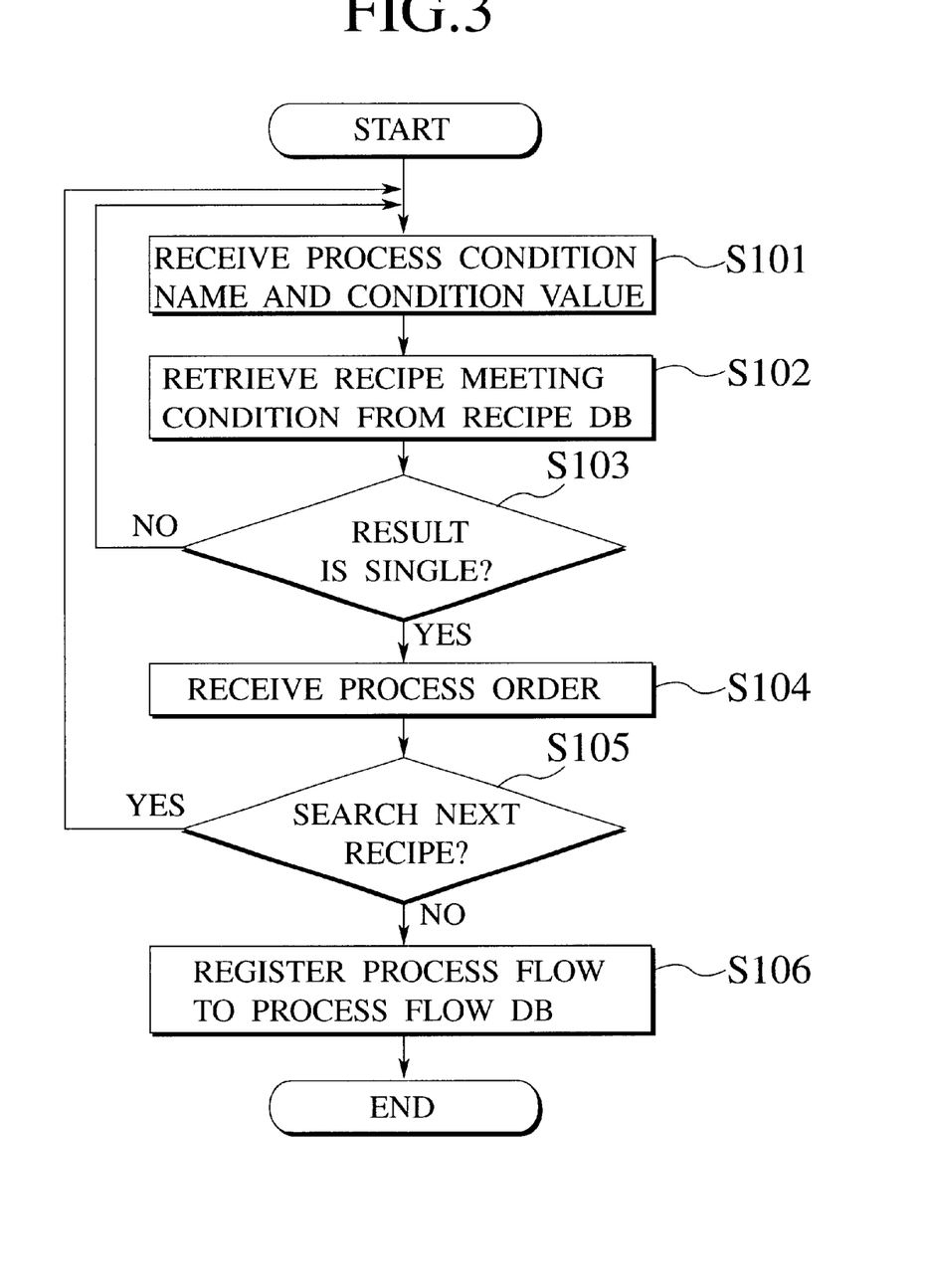
FIG. 3 is a flow chart showing a process flow preparation system according to an embodiment of the present invention.

FIG. 3 is a flow chart showing the process flow preparation system according to an embodiment of present invention. First, the process flow preparation system receives at least one process condition name and condition value (step S101). An operator, who prepares the process flow, inputs using input device 100, the condition receiving unit 210 receives the input results, and the input results are stored in memory, etc. And then, the process flow preparation system retrieves a recipe meeting the condition from recipe DB 500 (step S102). The result of this retrieving is shown to the operator.

Next, the process flow preparation system determines whether or not the retrieve has returned a single result (step S103). If more the one results is returned, the system cannot specify the recipe, and the system prompts the operator to input a process condition name or process condition value for narrowing down the retrieving results (step S101). The retrieving results will be narrowed down until a single recipe is specified.

When a recipe has been specified at step S103, then the system prompts the operator to input the process order to receive the process sequence of the specified recipe (step S104). This specified recipe and received process sequence are stored temporarily.

Next, the system determines whether or not to search for another recipe (step S105). Generally, there is a plurality of recipes when preparing a process flow. The system proceeds to step S101 if it is necessary to search another recipe. The description following step S101 will be omitted since the step was described above.

If all recipes of the process flow are specified, the system registers the process flow with the process sequence information to the process flow DB 400 (step S106). The term 'process sequence information' means the information in connection with the order of recipe. Such as number of process sequences, etc. If recipes of a process flow are registered in sequence, the process sequence may not need to be registered to the process flow of DB 400.

In this embodiment, the process flow preparation system determines an operator to input process conditions freely, and shows the recipe meeting the process conditions. And the system determines the operator to input process conditions as long as the recipe is specified. Namely, the process flow preparation system prompts the operator to input the process conditions as operator's think, in other words, the operator does not specify the recipe using so-called a "tree structure", but can specify the recipe as a "network structure".

Therefore, it is unnecessary to categorize the process in a menu style. And since an operator can specify the recipe freely, the efficiency of preparation of the process flow increases.

Figure 4:
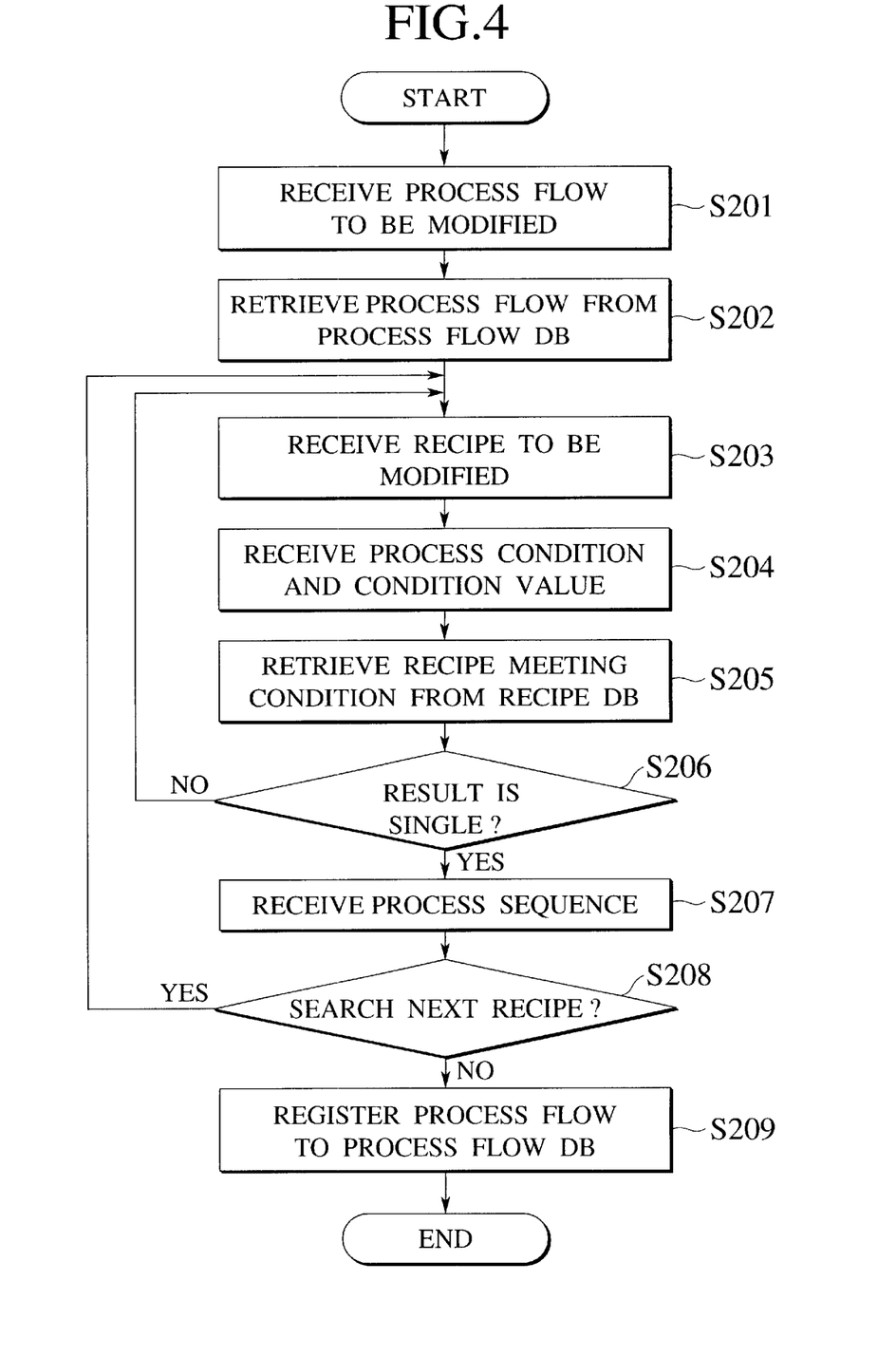
FIG. 4 is a flow chart showing the process flow preparation system according to another embodiment of present invention.

FIG. 4 is a flow chart showing a process flow preparation system according to another embodiment of the present invention. This flow chart shows an embodiment of the process flow preparation system that modifies an existing process flow. First, the system prompts an operator to input an existing process flow to receive the process flow to be modified (step S201). The operator who produces the process flow inputs uses input device 100 to specify the process flow to be modified.

Next, the system retrieves the process flow to be modified from process flow DB 400 (step S202). If the process flow specified by the operator does not exist, the system shows a message prompting the operator to input again. On the other hand if the process flow exists, the contents of process flow are shown by display device 300.

Next, the system receives the recipe to be modified (step S203). The system prompts the operator to input the recipe to be modified at the display device 300 etc. The operator may input the number of process flow sequence to specify the recipe to be modified.

Next, the system receives a process condition name and condition value (step S204). The operator who produces a process flow inputs using input device 100. The condition receiving unit 210 receives the input results, and the input results are stored in memory, etc.

Then, the system retrieves a recipe meeting the input condition from recipe DB 500 (step S205). The result of this retrieving is shown to the operator by display device 300.

Next, the process flow preparation system determines whether or not the retrieve has returned a single result (step S206). If more than one result is returned, the system cannot specify the recipe, and the system prompts the operator to input a process condition name or process condition value for narrowing down the retrieving results (step S203). The retrieving results will be narrowed down until a single recipe is specified.

When at least one recipe has been specified at step S206 then the system prompts the operator to input the process order to receive the process sequence of the specified recipe (step S207). This specified recipe and received process sequence are stored temporarily.

Next, the system determines whether to search for another recipe or not (step S208). Generally, there is a plurality recipes when preparation a process flow. The system proceeds to step S203 if it is necessary to search another recipe. The description of following step S203 will be omitted since the step was described above.

If all recipes to be modified are specified, the system registers the process flow with process sequence information to the process flow DB 400 (step S209).

An example of the present invention will be described with reference to the accompanying drawings.

Figure 5:
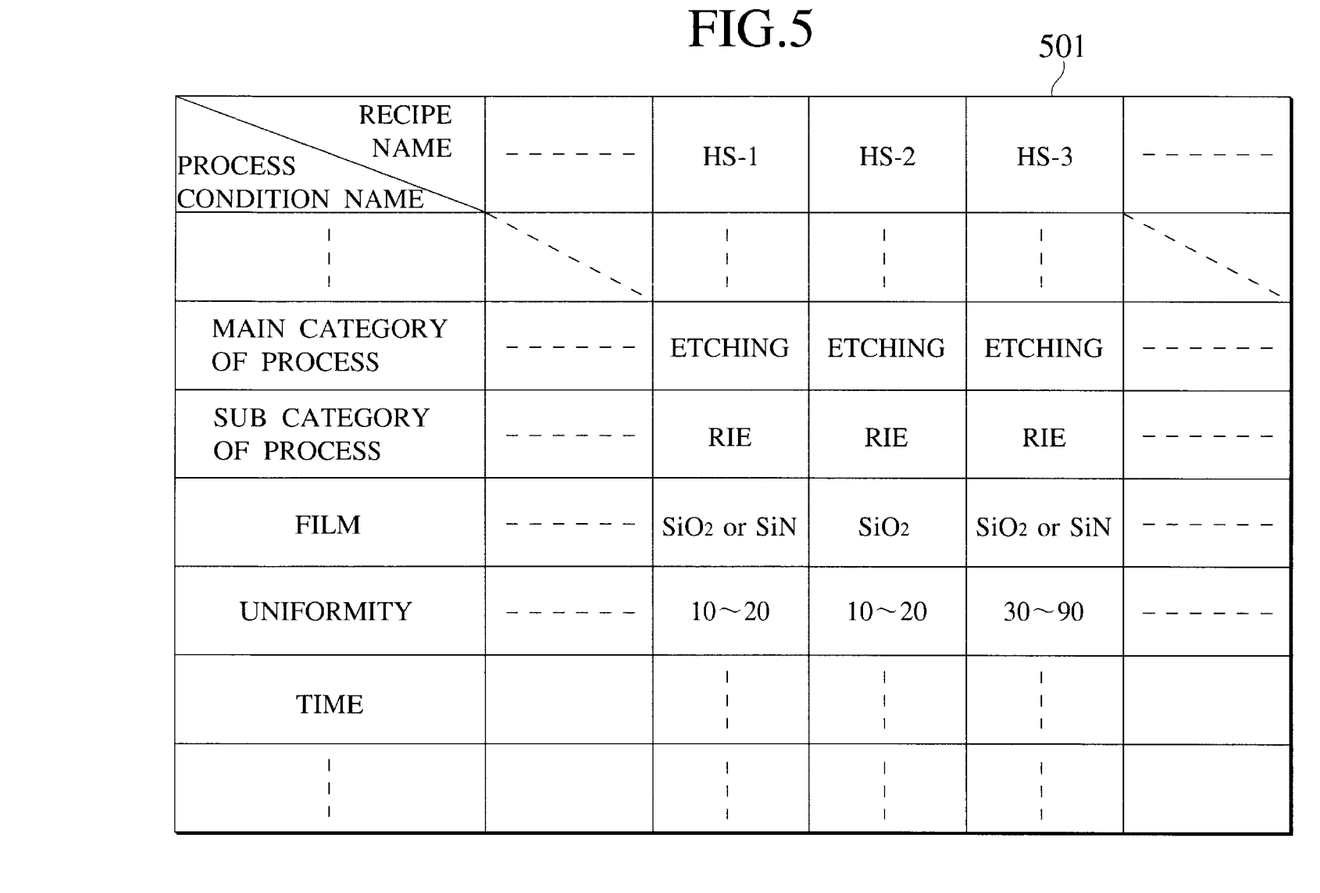
FIG. 5 shows an example of recipe DB 501 example according to an embodiment of present invention.

FIG. 5 shows an example of recipe DB 501 for a concrete example according to an embodiment of present invention. This recipe DB 501 has a database structure that primary key is recipe name. The process condition name and process condition value of each recipe are stored with relation to the recipe name. In FIG. 5, the vertical axis represents the process condition name, and the horizontal axis represents the recipe name. For example, FIG. 5 shows "main category of process", "sub category of process", "film", "uniformity", "time", and the like as a process condition name. Each process condition is stored with relation to the recipe name. For example, "etching" is stored as the main category of process of recipe name "HS-1". "RIE" is stored as the sub category of process thereof. "SiO2 or SiN" is stored as the film of process thereof. "10 to 20" is stored as the uniformity of process thereof. Here, the meaning of word "process conditions" includes process condition name and process condition values.

Figure 6:
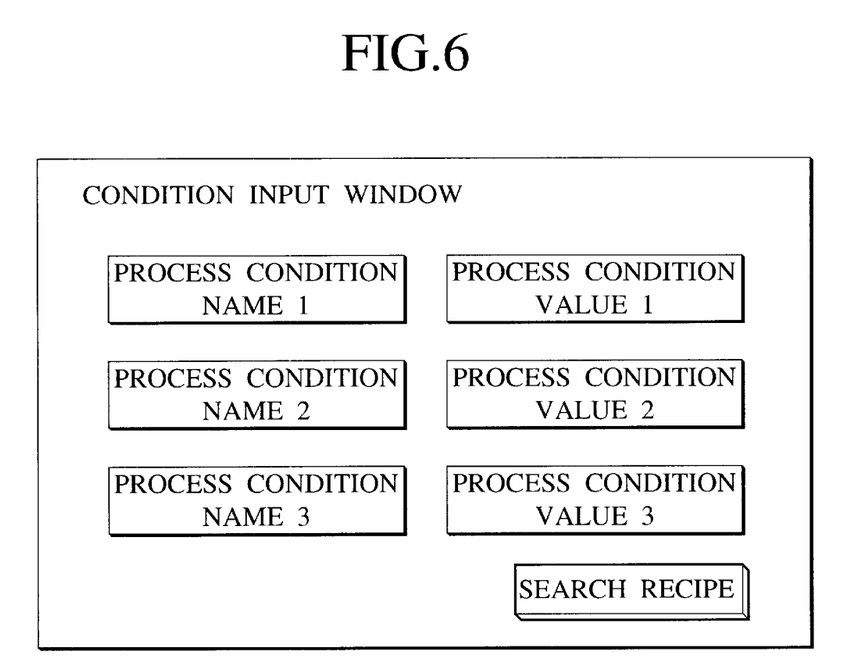
FIG. 6 shows an example window for receiving process conditions.

FIG. 6 shows an example window for receiving process conditions. The display device 300 may show this window and the system prompts the operator to input the process conditions using the input device 100. In this example, the process conditions include the process condition name and process condition value. In this example, the operator can input three process condition names and process condition values. The present invention, however, is not limited to this example. The operator can input "main category of process" as the process condition name 1, and "etching" as the process condition value 1. The operator can also input "sub category" as the process condition name 2, and "RIE" as the process condition value. Furthermore, the operator can input "film" as the process condition name 3, and "SiO2" as the process condition value 3. Then, the operator clicks the "search recipes" bottom shown in FIG. 5. The system retrieves the recipes meeting the inputted conditions from recipe DB 500.

Figure 7:
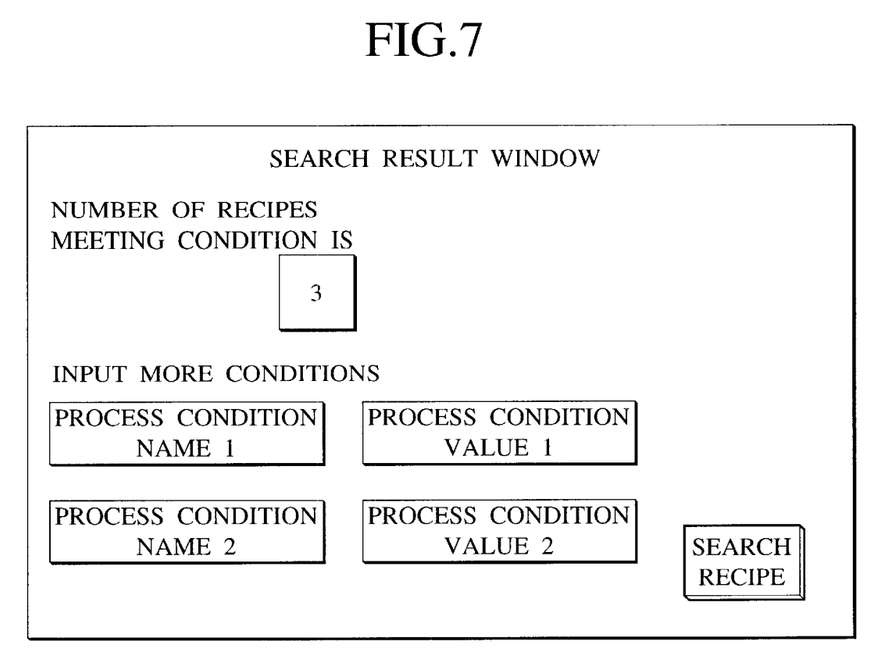
FIG. 7 shows an example window for showing retrieving results.

FIG. 7 shows an example window for showing retrieving results. The retrieving results meeting the conditions inputted by the operator are 3 recipes as shown in FIG. 5. So, retrieving result window shows "3" as the number of recipe meeting the condition. The system prompts the operator to input further process conditions to specify the recipe. In this example, the operator inputs "uniformity" as process condition name 1, and "more than or equal to thirty" as a process condition value. Here, the system may show the retrieved recipes meeting these conditions, and the operator may select one from the retrieved recipes.

When the operator clicks the search recipe bottom, the system retrieves the recipe meeting the added conditions inputted by the operator shown in FIG. 7. Or the system retrieves the recipe among the three meeting the conditions inputted by operator shown in FIG. 7.

Figure 8:
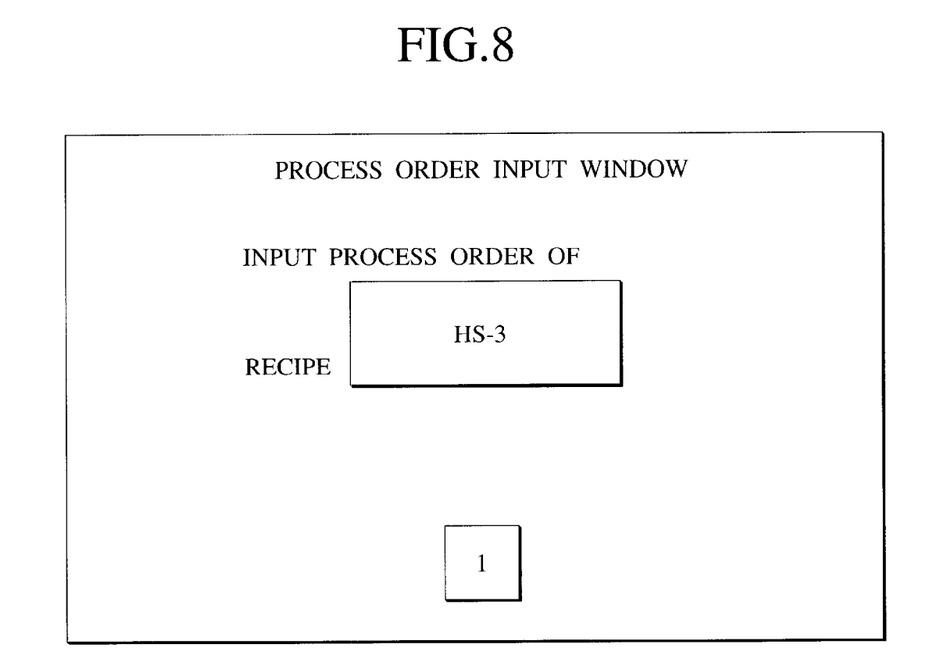
FIG. 8 shows an example window for receiving a process sequence.

FIG. 8 shows an example window for receiving process sequence. As described above, the system prompts the operator to input the process conditions repeatedly, until one recipe is found meeting the conditions. If the recipe is specified, the system shows the window shown in FIG. 8, and prompts the operator to input process sequence of the specified recipe. The process sequence of the specified recipe is then determined.

In this fashion, when the recipe is specified, the system receives the process sequence of the recipe.

Figure 9:
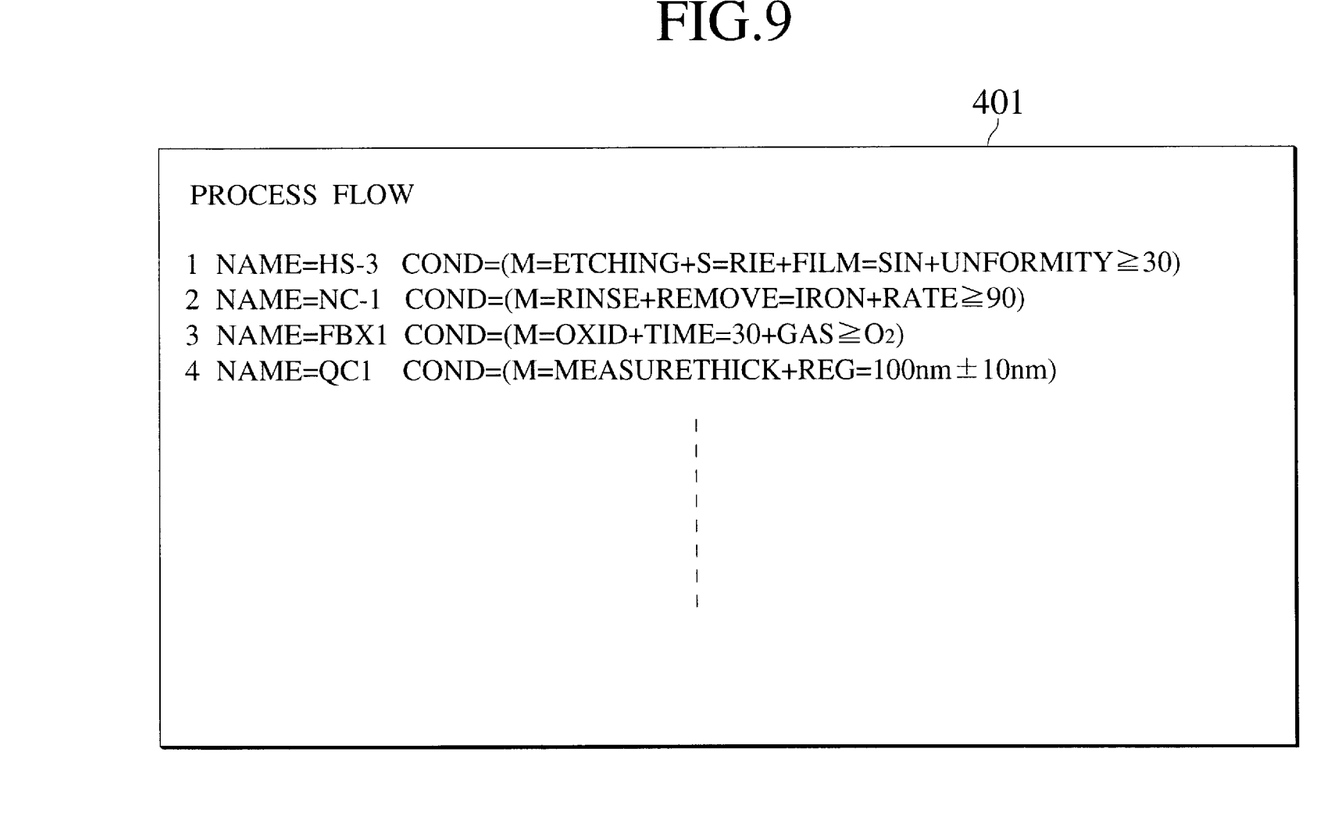
FIG. 9 shows an example window for showing a process flow produced by an embodiment of present invention.

FIG. 9 shows an example window for showing process flow produced by an embodiment of present invention. The first line of this process flow shows the "HS-3" recipe, and shows the condition of the "HS-3" recipe. This process flow is characterized by showing only process condition name(s) and process condition value(s) inputted by the operator. The process flow in the prior art cannot show the process conditions because conditions of each process are huge. However, this process flow according to the embodiment shows only the conditions used in specified the recipe. In this fashion, the process flow can be shown on a display device like a CRT, and the operator can grasp the process easily and intuitively.

In this embodiment, the process flow preparation system prompts the operator to input process conditions freely, and the operators can specify the recipe in a network structure. The system is characterized by preparation a process flow more easily and intuitively. The operator can freely prepare a process flow.

In this fashion, it is unnecessary to categorize the process like menu style. And if the operator can specify the recipe freely, the efficiency of the preparation process flow can increase.

A computer program product that realizes the process flow preparation as described above may be stored on a recording medium. The program stored in the recording medium is read into a computer system, so that the above-described process flow preparation can be realized by executing the program while controlling the computer. The recording medium includes such devices as a memory device, magnetic disk device, and an optical disk device, that are able to record the program. For example, the recording medium could be CD-ROM, DVD, ZIP, JAZ, MO, DAT, or the like.

Figure 10:
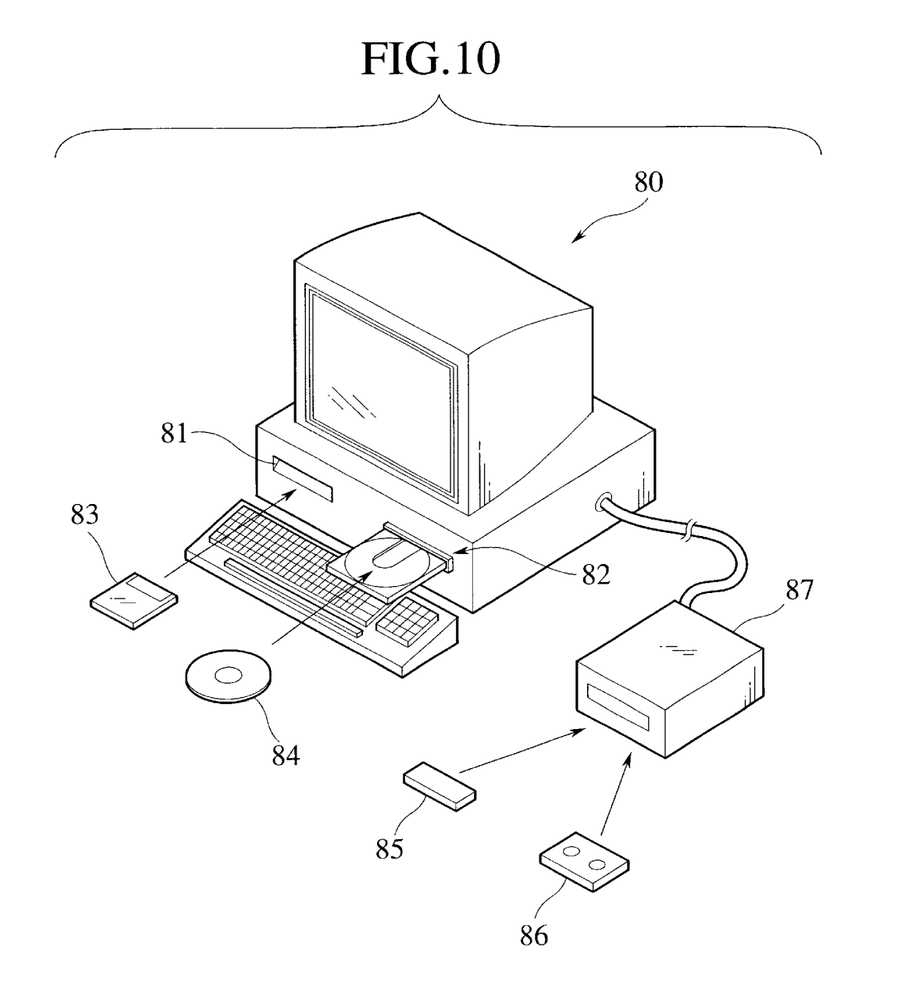
FIG. 10 shows an example of computer system that reads a medium containing a program.

FIG. 10 schematically shows one example of a computer system that reads a program stored in the recording medium, and performs production scheduling management according to the procedure described in the program. The computer system 80 is provided, at a front face of its main body, with a floppy disk drive 81, and CD-ROM or DVD drive 82. A drive device 87 is connected to a computer system 80. The drive device that permits reading and writing of a recording medium, such as ZIP, JAZ, MO, or DAT. A floppy disk 83 as a magnetic disk device, or CD-ROM or DVD 84 as an optical disk device, is inserted into each drive through a slot, and a certain reading operation is performed, so that the program stored in the recording medium can be installed in the computer system. Similarly, each type of medium 85, 86 may be inserted into a slot of a drive device 87, and a certain reading operation may be performed. In this manner, the production scheduling management can be performed by the computer system.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A process flow preparation system comprising:
    a condition receiving unit for receiving and storing at least one process condition;
    a recipe storing unit for storing recipe names and corresponding process conditions;
    a recipe searching unit for searching and retrieving from the recipe storing unit at least one recipe meeting the at least one process condition;
    a process sequence receiving unit for receiving and storing a process sequence of the at least one retrieved recipe; and
    a process flow output unit for outputting a process flow including the at least one retrieved recipe and the process sequence of the at least one retrieved recipe,
    wherein the recipe searching unit searches for one or more recipes meeting the at least one process condition from the recipe storing unit, determines whether or not the search has retrieved a single result, and prompts an operator to input at least one of a process condition name and a process condition value for specifying results of the search if more than one result is returned.

2. A process flow preparation system as claimed in claim 1, wherein the process flow output unit outputs a process flow including the at least one retrieved recipe, the process sequence of the at least one retrieved recipe, and the at least one received process condition.

3. A process flow preparation system comprising:
    a process flow storing unit;
    a condition receiving unit that searches from the process flow storing unit a received process flow to be modified, and receives at least one process condition of a recipe to be modified;
    a recipe storing unit for storing recipe names and corresponding process conditions;
    a recipe searching unit for searching and retrieving from the recipe storing unit at least one recipe meeting the at least one process condition;
    a process sequence receiving unit for receiving and storing a process sequence of the at least one retrieved recipe; and
    a process flow output unit for outputting a process flow including the at least one retrieved recipe and the process sequence of the at least one retrieved recipe,
    wherein the recipe searching unit searches for one or more recipes meeting the at least one process condition from the recipe storing unit, determines whether or not the search has retrieved a single result, and prompts an operator to input at least one of a process condition name and a process condition value for specifying results of the search if more than one result is returned.

4. A process flow preparation system as claimed in claim 3, wherein the process flow output unit outputs a process flow including the at least one retrieved recipe, the process sequence of the at least one retrieved recipe, and the at least one received process condition.

5. A process flow preparation method comprising the steps of:
    receiving and storing at least one process condition;
    searching and retrieving from a recipe storing unit at least one recipe meeting the at least one process condition;
    receiving and storing a process sequence of the at least one retrieved recipe; and
    outputting a process flow including the at least one retrieved recipe and the process sequence of the at least one retrieved recipe,
    wherein the searching step searches for one or more recipes meeting the at least one process condition from the recipe storing unit, determines whether or not the search has retrieved a single result, and prompts an operator to input at least one of a process condition name and a process condition value for specifying results of the search if more than one result is returned.

6. A process flow preparation method as claimed in claim 5, wherein the outputting step outputs a process flow including the at least one retrieved recipe, the process sequence of the at least one retrieved recipe, and the at least one received process condition.

7. A process flow preparation method comprising the steps of:
    searching from a process flow storing unit a received process flow to be modified;
    receiving at least one process condition of a recipe to be modified;
    searching and retrieving from a recipe storing unit at least one recipe meeting the at least one process condition;
    receiving and storing a process sequence of the at least one retrieved recipe; and
    outputting a process flow including the at least one retrieved recipe and the process sequence of the at least one retrieved recipe,
    wherein the searching step searches for one or more recipes meeting the at least one process condition from the recipe storing unit, determines whether or not the search has retrieved a single result, and prompts an operator to input at least one of a process condition name and a process condition value for specifying results of the search if more than one result is returned.

8. A process flow preparation method as claimed in claim 7, wherein the outputting step outputs a process flow including the at least one retrieved recipe, the process sequence of the at least one retrieved recipe, and the at least one received process condition.

9. A computer program product used in a process flow preparation system, comprising:
    a first computer code configured to receive and store at least one process condition;
    a second computer code configured to search and retrieve from a recipe storing unit at least one recipe meeting the at least one process condition;
    a third computer code configured to receive and store a process sequence of the at least one retrieved recipe; and
    a fourth computer code configured to output a process flow including the at least one retrieved recipe and the process sequence of the at least one retrieved recipe,
    wherein the second computer code searches for one or more recipes meeting the at least one process condition from the recipe storing unit, determines whether or not the search has retrieved a single result, and prompts an operator to input at least one of a process condition name and a process condition value for specifying results of the search if more than one result is returned.

10. A computer program product used in a process flow preparation system as claimed in claim 9, wherein the fourth computer code outputs a process flow including the at least one retrieved recipe, the process sequence of the at least one retrieved recipe, and the at least one received process condition.

11. A computer program product used in a process flow preparation system, comprising:
   a first computer code configured to search from a process flow storing unit a received process flow to be modified;
   a second computer code configured to receive at least one process condition of a recipe to be modified;
   a third computer code configured to search and retrieve from a recipe storing unit at least one recipe meeting the at least one process condition;
   a fourth computer code configured to receive and store a process sequence of the at least one retrieved recipe; and
   a fifth computer code configured to output a process flow including the at least one retrieved recipe and the process sequence of the at least one retrieved recipe,
   wherein the third computer code searches for one or more recipes meeting the at least one process condition from the recipe storing unit, determines whether or not the search has retrieved a single result, and prompts an operator to input at least one of a process condition name and a process condition value for specifying results of the search if more than one result is returned.

12. A computer program product used in a process flow preparation system as claimed in claim 11, wherein the fifth computer code outputs a process flow including the at least one retrieved recipe, the process sequence of the at least one retrieved recipe, and the at least one received process condition.

* * * * *